United States Patent [19]

Mizutani et al.

[11] Patent Number: 5,429,709

[45] Date of Patent: Jul. 4, 1995

[54] METHOD OF MANUFACTURING POLYIMIDE MULTILAYER PRINTED WIRING BOARDS

[75] Inventors: Daisuke Mizutani; Yoshikatsu Ishizuki, both of Kawasaki, Japan

[73] Assignee: Fujitsu Limited, Kawasaki, Japan

[21] Appl. No.: 228,347

[22] Filed: Apr. 15, 1994

[30] Foreign Application Priority Data

Apr. 28, 1993 [JP] Japan ................................. 5-101603

[51] Int. Cl.⁶ .......................... B44C 1/22; C23F 1/02
[52] U.S. Cl. ........................................ 216/13; 216/83; 216/91; 216/100; 428/209
[58] Field of Search ............... 156/630, 634, 650, 652, 156/656, 659.1, 668, 664, 666, 901, 902, 637, 639; 428/209, 458, 473.5, 901; 252/79.2, 79.5

[56] References Cited

U.S. PATENT DOCUMENTS

| | | | |
|---|---|---|---|
| 5,322,593 | 6/1994 | Hasegawa et al. | 156/634 X |
| 5,378,310 | 1/1995 | Satoh et al. | 156/902 X |

FOREIGN PATENT DOCUMENTS

| | | |
|---|---|---|
| 63-175854 | 7/1988 | Japan . |
| 5-45882 | 2/1993 | Japan . |

*Primary Examiner*—William Powell
*Attorney, Agent, or Firm*—Nikaido, Marmelstein, Murray & Oram

[57] ABSTRACT

An etching process of a conductive layer in manufacturing polyimide multilayer printed wiring boards comprises the steps of dipping in an alkali aqueous solution for patterning the conductive layer, dipping in an acid aqueous solution for neutralizing the alkali residue, and washing with water thereby washing off the alkali residue. A curing process for each of polyimide layers is controlled so as to obtain a polyimide conversion ratio ranging between 60% and 100% after an initial curing process, and to obtain a polyimide conversion ratio close to 100% after formation of an uppermost polyimide layer.

9 Claims, No Drawings

METHOD OF MANUFACTURING POLYIMIDE MULTILAYER PRINTED WIRING BOARDS

BACKGROUND OF THE INVENTION

1. Field of the Invention

The present invention relates to a manufacturing method of multilayer printed wiring boards, and more particularly, to a manufacturing method of multilayer printed wiring boards comprising polyimide laminated layers. Polyimide is known as an insulation material having a heat-resistant characteristic, and widely used for printed wiring boards. The manufacturing method of the polyimide multilayer printed wiring boards according to the invention is effective for preventing the printed wiring board from deterioration in a mechanical strength during manufacturing steps.

2. Description of the Related Art

High polymerized organic compounds (abbreviated briefly as polymers) such as polyimide, epoxy, polyester, and polycarbonate are widely used in electronic industry as an insulation material. Among them, polyimide is an extremely stable material against heat application. The polyimide does not decompose when heated up to a temperature of about 400° C., therefore, the polyimide is known as a heat-resistant material and widely used for an insulation layer between multiple-laminated wiring layers of printed wiring board or semiconductor integrated circuit.

Hereinafter, the known manufacturing method of polyimide multilayer printed circuit boards is outlined.

Polyamic acid is known as one of precursors for producing polyimide by dehydration and ring closure. The polyamic acid having a molecular formula shown by the following formula (1) is known to be fluid and suitable for coating on a substrate.

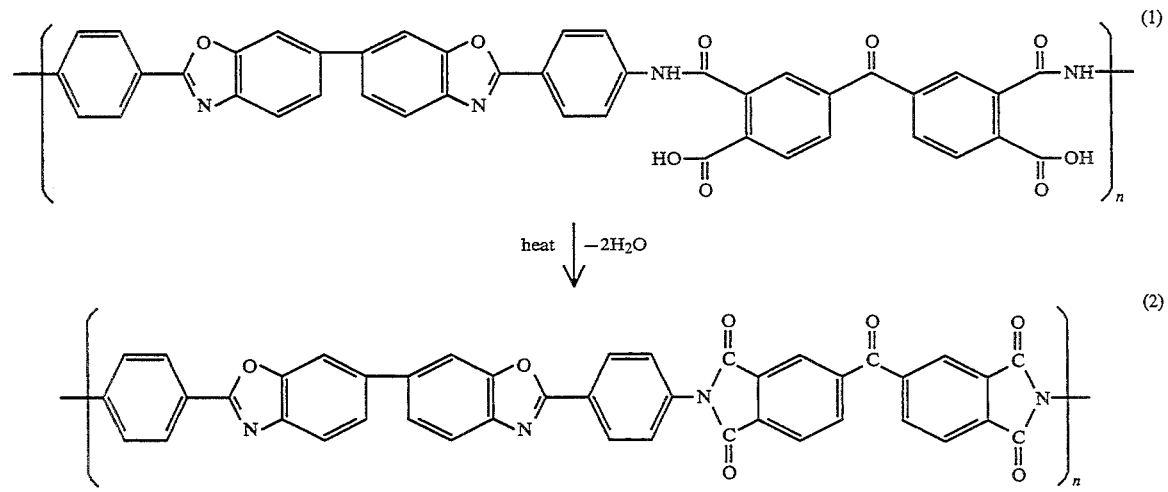

The polyamic acid (1) is coated on a heat resistant insulation board of ceramic such as alumina. The ceramic board with the polyamic acid coating is dried and thereafter heated for curing, thereby the polyamic acid dehydrating and causing ring closure reaction forming a polyimide insulation layer shown by a molecular formula (2).

An electrically conductive layer is deposited on the polyimide insulation layer by sputtering or vacuum evaporation technologies. The conductive layer thus formed is subjected to the known photolithography processes, forming a patterned wiring layer on the polyimide insulation layer.

The ceramic board with the polyimide insulation layer and the patterned wiring layer thereon is once again subjected to the same steps of coating the polyamic acid. After drying and curing steps, a second polyimide insulation layer is formed. Via-holes are next formed by the conventional photolithography processes, which are necessary for connecting the underlying patterned wiring layer with an overlying wiring layer subsequently formed on the second polyimide insulation layer. If the polyamic acid is of an ultra-violet ray sensitive type, the processes for forming the via-holes are simplified, whereby necessary regions of the second polyamic layer are selectively exposed to ultra-violet rays and, after a developing process, the polyamic layer is heated for curing, forming the second polyimide layer with the via-holes.

An electrically conductive layer is deposited on the second polyimide layer by sputtering or vacuum evaporation technologies and thereafter subjected to the photolithography processes, forming a second patterned wiring layer on the second polyimide layer in the same way.

These steps are repeated necessary times for obtaining a required number of polyimide layers and wiring layers of the printed wiring board.

The polyimide multilayer printed wiring board of the prior art as described above has a weak point that an embrittlement characteristic of the polyimide layers deteriorates. Mechanical strength of polyimide layers of the multilayer printed wiring board becomes weaker than that of a polyimide single-layer printed wiring board. In order to enhance reliability of the polyimide multilayer printed wiring boards, improvement in the embrittlement characteristic is required.

SUMMARY OF THE INVENTION

An object of the present invention is to solve the above problem and provide a method of manufacturing a polyimide multilayer structure having improved mechanical characteristics of the polyimide layer.

The method in accordance with the invention for manufacturing a polyimide multilayer structure, comprising the repeated steps of; forming a polyamic acid layer on a substrate and curing the polyamic acid layer by heating with the result of converting the polyamic acid layer to polyimide layer, and forming a patterned conductive layer on the polyimide layer:

the method characterized in that each forming step of the patterned conductive layer comprises the substeps of; dipping the substrate in an alkali solution, and thereafter dipping in an acid solution.

The invention further provides a method of improving quality of the polyimide layer by applying a bubble jet stream during the above dipping step in the acid solution.

The invention still further provides a method of improving quality of the polyimide layer by controlling a polyimide conversion ratio for each polyimide layer when the each polyimide layer finishes its first curing step.

DETAILED DESCRIPTION OF THE PREFERRED EMBODIMENTS

Inventors of the present invention investigated tile factors which have influence on an embrittlement characteristic of polyimide layers of the multilayer printed wiring board, and found that the following two factors should be taken into consideration.

(a) A treatment of dipping a polyimide layer in an alkali solution has some effect of improving adhesion between two laminated polyimide layers, however on the other hand, existence of alkalis will have a bad effect on the embrittlement characteristic while tile polyamic acid is cured forming polyimide by the dehydration and ring closure.

(b) Decomposition of polymer caused by an excessive long heat treatment in curing steps.

With regard to item (a), though polyimide is a chemically stable polymer, the polyimide during the curing step is liable to dissolve in water under the existence of alkali [the water is formed by the dehydration of the polyamic acid in the curing step, which is shown by the conversion from the molecular formulae (1) to (2)]. The reason therefor is considered that the alkali comprised in the polyamic acid as impurity will help the polyimide to dissolve in water by breaking off imide-rings and reducing a molecular weight.

It seems very difficult to avoid alkali components being mixed in the polyimide layer in the manufacturing processes of the polyimide multilayer structure. Between forming steps of two polyimide layers, a conductive layer is formed and patterned. The patterning processes include an etching step for the conductive layer using an alkali solution. Generally, each of conductive layers formed on polyimide layers is of a multilayer structure, for example, composed of three laminated layers of chromium/copper/chromium (Cr/Cu/Cr). The copper layer is sandwiched between the chromium layers, and therefore, the polyimide layer contacts with the chromium layer only.

In patterning the conductive layer, a selective etching process for patterning the chromium layer uses a mixed aqueous solution of potassium ferricyanide [$K_3Fe(CN)_6$] and sodium hydroxide [NaOH], and an etching process for patterning the copper layer uses an ammonium persulfate [$(NH_4)_2S_2O_8$] aqueous solution.

When the above etching steps for three layers are finished, it is inevitable that residue of alkali solution (in the above case, NaOH) remains on the polyimide layer. The existing washing method is to wash the substrate with the polyimide layer in pure water after formation of the patterned conductive layer, however, this method can not remove these residues completely. In accordance with the present invention, it is found that the substrate after formation of the patterned conductive layer is preferable to be washed in an acid solution, thereby neutralizing and removing alkali residue. It is further preferable to use a bubble jet of a carbon dioxide gas blown into the solution during the washing process.

With regard to item (b), a curing temperature ranging between 350° C. and 450° C. is used for curing a polyamic acid layer coated on the substrate, and it requires a few hours to complete the curing process. During the curing process, cross linking and polymerization occur in the polyamic acid, with the result of gradually converting the polyamic acid to the polyimide with the dehydration. If a new polyamic acid layer is coated and cured after the underlying polyamic acid layer previously formed is completely (100%) converted to the polyimide, the underlying polyimide layer shows deterioration of an embrittlement characteristic after the following curing process due to stress caused by excessive long heating, resulting in forming crack defects. In a multilayer printed wiring board, the lower the polyimide layer is, the more it is subjected to heat stress and the deterioration of polyimide progresses.

Conversion status from the polyamic acid to the polyimide may be expressed by a polyimide conversion ratio (hereinafter briefly abbreviated as PCR in %). Polyimide of PCR X % means that an X % amount of polyamic acid has dehydrated and formed ring closures. If the polyamic acid is completely converted to the polyimide, PCR in this case is 100%. The polyimide, PCR of which is greater than 60% preferably greater than 70%, has substantially the same mechanical strength as that of polyimide with PCR 100% In the invention, PCR values for each of polyimide layers is controlled to be greater than 60% after an initial curing stage of manufacturing processes of the multilayer printed wiring boards, and to approach 100% as close as possible at the final stage for forming an uppermost polyimide layer.

The PCR of the lower polyimide layer will increase with each formation (curing) step of the upper polyimide layers. In order to avoid the polyimide layer being subjected to excessive long heat treatment which causes deterioration of mechanical strength and embrittlement of the polyimide layer, the PCR of the lower polyimide layer at a time when the initial curing process is finished, is controlled to have an appropriate PCR value ranging between 60% and 100%. The thus selected PCR value for the lower layer grows up each time when subsequent upper polyimide layers are formed thereon. When formation of the uppermost polyimide layer is completed, it is preferable that the thus selected PCR value gets to 100%.

The above method of controlling the PCR value ranging between 60% and 100% is easy when a number of polyimide layers of the multilayer printed wiring board is small. However, the number of polyimide layers increases up to 10 to 20 layers, there remains anxiety that the PCR for the lower polyimide layers will reach 100% at an early stage of repeated curing processes of the upper layers, and that further re-heating processes will cause embrittlement of the lower polyimide layer. The inventors found that a polyimide layer once subjected to a heating and curing process with the PCR between 60% and 100%, will not resume a curing function immediately at the subsequent re-heating processes, and that it requires time for storing heat energy to resume the curing function.

PCR for each of polyimide layers of the multilayer printed wiring board at a time when the each of polyimide layers finishes an initial heat process, is preferably controlled such that, when fabrication of the multilayer printed wiring board is completed, the PCR values of all polyimide layers reach 100%.

EXAMPLE 1

Polyamic acid, viscosity of which has been adjusted using N-methylpyrrolidone, is coated on an alumina substrate and dried, a thickness thereof being controlled to be 20 μm after curing. The substrate with the polyamic acid coating is heated for 3 hours at 350° C. for curing, resulting in forming a polyimide layer having a thickness of 20 μm. Analysis shows that sodium (Na) concentration in the polyimide layer is about 5.1 ppm.

The substrate with the polyimide layer is dipped in a 20% sodium hydroxide (NaOH) aqueous solution for 10 minutes, and thereafter washed with pure water. Analysis of the polyimide layer shows that Na concentration increases to 9.6 ppm. This fact shows that Na of a 4.5 ppm concentration is added and remains by adsorption.

The above substrate is dipped in a 7% nitric acid ($HNO_3$) aqueous solution for 10 minutes, and thereafter washed with pure water. An Na concentration in the polyimide layer decreases to 4.9 ppm. This shows that the remaining alkali in the polyimide layer is almost removed.

The above steps of coating the polyamic acid, dipping in the NaOH aqueous solution, and dipping in the $HNO_3$ aqueous solution are repeated for 20 cycles, forming a laminated multilayer of 20 polyimide layers. No crack is found in the polyimide layers. On the contrary, the prior art method without the dipping step in the $HNO_3$ solution shows that cracks are found after formation of 6 polyimide layers.

EXAMPLE 2

In the similar way as in Example 1 except the cure temperature, polyamic acid, viscosity of which has been adjusted using N-methylpyrrolidone, is coated on an alumina substrate and dried. The substrate with the polyamic coating is heated for 3 hours at 400° C. for curing, resulting in forming a polyimide layer having a thickness of 20 μm. The polyimide layer thus formed is comparatively porous, however, analysis shows that Na concentration in the polyimide layer is 5.2 ppm.

The above substrate with the polyimide layer is dipped in a 20% NaOH aqueous solution for 10 minutes, and thereafter washed with pure water. The substrate is further dipped in a 7% $HNO_3$ aqueous solution for 10 minutes and washed with pure water. Analysis shows that Na concentration in the polyimide layer is 7.8 ppm, which means Na concentration increases by 2.6 ppm because the polyimide layer is porous. The acid treatment of $HNO_3$ is not sufficient.

Instead of dipping in the 7% $HNO_3$ aqueous solution only, the substrate is dipped in the 7% $HNO_3$ aqueous solution and further a carbon dioxide gas in a form of bubble jet is blown to the substrate. An Na concentration of the thus processed polyimide layer is 5.1 ppm, which means the adsorbed alkali is completely removed.

EXAMPLE 3

Polyamic acid, viscosity of which has been adjusted using N-methylpyrrolidone, is coated on an alumina substrate and dried. The substrate with the polyamic acid coating is subjected to a curing step at temperature of 450° C. changing a curing time for each of the polyimide layers. Coating and curing steps are repeated 5 times forming 5 polyimide layers, thereby curing times for a first layer to a fifth layer being controlled to be 1.0, 1.5, 2.0, 2.5, and 3.0 hours respectively. Polyimide conversion ratios (PCR) when each of five polyimide layers has finished its first curing step, are found to be 62, 80, 92, 96, and 100% respectively. A laminated structure of polyimide layers comprises no crack caused by embrittlement of the polyimide layers.

On the contrary, when each of polyimide layers is cured to PCR 100% cracks are found at a time when a fourth polyimide layer is formed.

The above PCR data are obtained by an intensity ratio measured at two absorption bands, namely, 1780 $cm^{-1}$ for an imide-ring and 1500 $cm^{-1}$ for an aromatic-ring respectively using an infrared spectroscopic analysis method.

What is claimed is:

1. A method of manufacturing a polyimide multilayer structure on a substrate comprising the steps of; (a) forming a polyamic acid layer on the substrate, and curing the polyamic acid layer by heating so as to form a polyimide layer by dehydration and ring closure of the polyamic acid, (b) forming a patterned conductive layer on the polyimide layer, and (c) repeating the above steps (a) and (b) until the required multilayer structure is obtained, wherein said step (b) comprises the substeps of; dipping the substrate with polyimide layer in an alkali solution, thereafter dipping in an acid solution, and washing the substrate.

2. A method of manufacturing a polyimide multilayer structure on a substrate as recited in claim 1, wherein
said substep of dipping in the alkali solution is an etching process for patterning the conductive layer.

3. A method of manufacturing a polyimide multilayer structure as recited in claim 1, wherein
said substep of dipping in the acid solution comprises a use of a bubble jet stream of a carbon dioxide gas blown into the solution.

4. A method of manufacturing a polyimide multilayer structure as recited in claim 1, wherein
a polyimide conversion ratio of each of polyimide layers after an initial curing step of said each polyimide layer ranges between 60% and 100%.

5. A method of manufacturing a polyimide multilayer structure as recited in claim 4, wherein each of the polyimide conversion ratios after the respective initial curing step gradually increase in an order from a lowermost polyimide layer to an uppermost polyimide layer.

6. A method of manufacturing a polyimide multilayer structure as recited in claim 5, wherein
all polyimide conversion ratios after a final curing step of the uppermost polyimide layer approach close to 100%.

7. A method of manufacturing a polyimide multilayer structure as recited in claim 2, wherein
said conductive layer comprises a chromium layer, and said etching process comprises a substep of dipping in a mixed aqueous solution of potassium ferricyanide [$K_3Fe(CN)_6$] and sodium hydroxide [NaOH].

8. A method of manufacturing a polyimide multilayer structure as recited in claim 2, wherein said conductive layer comprises three laminated layers of chromium, copper, and chromium, and said etching process comprises substeps of dipping in a mixed aqueous solution of potassium ferricyanide [$K_3Fe(CN)_6$] and sodium hydroxide for etching the chromium layer, and dipping in an ammonium persulfate [$(NH_4)_2S_2O_8$] aqueous solution for etching the copper layer.

9. A polyimide multilayer printed wiring board manufactured in accordance with the method as recited in claim 1.

* * * * *

UNITED STATES PATENT AND TRADEMARK OFFICE
CERTIFICATE OF CORRECTION

PATENT NO. : 5,429,709
DATED : July 4, 1995
INVENTOR(S) : Daisuke MIZUTANI et al It is certified that error appears in the above-identified patent and that said Letters Patent is hereby corrected as shown below:

Column 3, line 19, delete "tile" and substitute therefor -- the --; and line 28, delete "tile" and substitute therefor -- the --.

Signed and Sealed this

Fifth Day of December, 1995

Attest:

BRUCE LEHMAN

Attesting Officer

Commissioner of Patents and Trademarks